United States Patent
Zous et al.

(10) Patent No.: US 7,187,590 B2
(45) Date of Patent: Mar. 6, 2007

(54) METHOD AND SYSTEM FOR SELF-CONVERGENT ERASE IN CHARGE TRAPPING MEMORY CELLS

(75) Inventors: Nian-Kai Zous, Ping Zhen (TW); Wen-Jer Tsai, Hsinchu (TW); Hung-Yueh Chen, Hsinchu (TW); Tao Cheng Lu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/876,255

(22) Filed: Jun. 24, 2004

(65) Prior Publication Data

US 2005/0237813 A1    Oct. 27, 2005

Related U.S. Application Data

(60) Provisional application No. 60/566,669, filed on Apr. 30, 2004, provisional application No. 60/565,377, filed on Apr. 26, 2004.

(51) Int. Cl.
*G11C 16/04* (2006.01)

(52) U.S. Cl. .............. 365/185.3; 365/185.24; 365/185.19

(58) Field of Classification Search ........... 365/185.24, 365/185.25, 185.19, 185.3, 185.03
See application file for complete search history.

(56) References Cited

U.S. PATENT DOCUMENTS

| | | | |
|---|---|---|---|
| 4,959,812 A | 9/1990 | Momodomi et al. | |
| 5,270,969 A | 12/1993 | Iwahashi | |
| 5,278,439 A | 1/1994 | Ma et al. | |
| 5,355,464 A | 10/1994 | Fandrich et al. | |
| 5,408,115 A | 4/1995 | Chang | |
| 5,424,569 A | 6/1995 | Prall | |
| 5,448,517 A | 9/1995 | Iwahashi | |
| 5,483,486 A | 1/1996 | Javanifard et al. | |
| 5,485,422 A | 1/1996 | Bauer et al. | |
| 5,509,134 A | 4/1996 | Fandrich et al. | |

(Continued)

FOREIGN PATENT DOCUMENTS

JP    09162313    6/1997

(Continued)

OTHER PUBLICATIONS

Shin, Yoocheol, et al., "High Reliable SONOS-type NAND Flash Memory Cell with Al2O3 for Top Oxide," Non-Volatile Semiconductor Memory Workshop (2003), 2 pages.

(Continued)

*Primary Examiner*—Anh Phung
*Assistant Examiner*—Hien Nguyen
(74) *Attorney, Agent, or Firm*—Haynes Beffel & Wolfeld LLP

(57) ABSTRACT

A process and a memory architecture for operating a charge trapping memory cell is provided. The method for operating the memory cell includes establishing a high threshold state in the memory cell by injecting negative charge into the charge trapping structure to set a high state threshold. The method includes using a self-converging biasing procedure to establish a low threshold state for the memory cell by reducing the negative charge in the charge trapping structure to set the threshold voltage for the cell to a low threshold state. The negative charge is reduced in the memory cell by applying a bias procedure including at least one bias pulse. The bias pulse balances charge flow into and out of the charge trapping layer to achieve self-convergence on a desired threshold level. Thereby, an over-erase condition is avoided.

74 Claims, 8 Drawing Sheets

U.S. PATENT DOCUMENTS

| | | | |
|---|---|---|---|
| 5,515,324 | A | 5/1996 | Tanaka |
| 5,566,120 | A | 10/1996 | D'Souza |
| 5,602,775 | A | 2/1997 | Vo |
| 5,644,533 | A | 7/1997 | Lancaster et al. |
| 5,694,356 | A | 12/1997 | Wong et al. |
| 5,745,410 | A | 4/1998 | Yiu et al. |
| 5,768,192 | A | 6/1998 | Eitan |
| RE35,838 | E | 7/1998 | Momodomi et al. |
| 5,966,603 | A | 10/1999 | Eitan |
| 6,011,725 | A | 1/2000 | Eitan |
| 6,034,896 | A | 3/2000 | Ranaweera et al. |
| 6,074,917 | A | 6/2000 | Chang et al. |
| 6,096,603 | A | 8/2000 | Chang et al. |
| 6,172,907 | B1 | 1/2001 | Jenne |
| 6,194,272 | B1 | 2/2001 | Sung |
| 6,215,148 | B1 | 4/2001 | Eitan |
| 6,219,276 | B1 | 4/2001 | Parker |
| 6,297,096 | B1 | 10/2001 | Boaz |
| 6,320,786 | B1 | 11/2001 | Chang et al. |
| 6,363,013 | B1 | 3/2002 | Lu et al. |
| 6,396,741 | B1 | 5/2002 | Bloom et al. |
| 6,436,768 | B1 | 8/2002 | Yang et al. |
| 6,458,642 | B1 | 10/2002 | Yeh et al. |
| 6,487,114 | B2 | 11/2002 | Jong et al. |
| 6,512,696 | B1 | 1/2003 | Fan et al. |
| 6,538,923 | B1 | 3/2003 | Parker |
| 6,552,386 | B1 | 4/2003 | Wu |
| 6,566,699 | B2 | 5/2003 | Eitan |
| 6,587,903 | B2 | 7/2003 | Roohparvar |
| 6,614,070 | B1 | 9/2003 | Hirose et al. |
| 6,614,694 | B1 | 9/2003 | Yeh et al. |
| 6,643,181 | B2 | 11/2003 | Sofer et al. |
| 6,643,185 | B1 | 11/2003 | Wang et al. |
| 6,646,924 | B1 | 11/2003 | Tsai et al. |
| 6,657,894 | B2 | 12/2003 | Yeh et al. |
| 6,670,240 | B2 | 12/2003 | Ogura et al. |
| 6,670,671 | B2 | 12/2003 | Sasago et al. |
| 6,690,601 | B2 | 2/2004 | Yeh et al. |
| 6,714,457 | B1 | 3/2004 | Hsu et al. |
| 6,912,163 | B2 | 6/2005 | Zheng et al. |
| 6,937,511 | B2 * | 8/2005 | Hsu et al. .............. 365/185.03 |
| 2002/0179958 | A1 | 12/2002 | Kim |
| 2003/0036250 | A1 | 2/2003 | Lin et al. |
| 2004/0084714 | A1 | 5/2004 | Ishii et al. |
| 2004/0145024 | A1 | 7/2004 | Chen et al. |
| 2005/0001258 | A1 | 1/2005 | Forbes |

FOREIGN PATENT DOCUMENTS

| | | |
|---|---|---|
| JP | 11233653 | 8/1999 |
| WO | WO 94/28551 | 12/1994 |

OTHER PUBLICATIONS

U.S. Appl. No. 10/289,866, filed Nov. 6, 2002, "Erasing Method for Non-Volatile Memory," 24 pages.

Taiwan Patent Application No. 91120417, 2002.

Janai Meir, "Data Retention, Endurance and Acceleration Factors of NROM Devices," IEEE, 41st Annual IRPS, Dallas, Texas (2003) 502-505.

Liu, Zhizheng, et al., "A New Programming Technique for Flash Memory Devices," VLSI Technology, Systems, and Applications, 1999. International Symposium on , Jun. 8-10, 1999 pp.:195-198.

Chung, Steve S., "Low Voltage/Power and High Speed Flash Memory Technology for High Performance and Reliability," The 3rd WIMNACT—Singapore, Oct. 15, 2003, 48 pages.

Blauwe, Jan De, "Nanocrystal Nonvolatile Memory Devices," IEEE Transactions on Nanotechnology, vol. 1, No. 1, Mar. 2002, 72-77.

Lee, Changhyun, "A Novel Structure of SiO2/SiN/High k Dielectrics, Al2O3 for SONOS Type Flash Memory," Extended Abstracts of the 2002 International Conference on Solid State Devices and Materials, Nagoya, 2002, 162-163.

White, Marvin H., et al., "On the Go with SONOS," Circuits & Devices, Jul. 2000, 22-31.

Yeh, CC., et al., "Novel Operation Schemes to Improve Device Reliability in a Localized Trapping Storage SONOS-type Flash Memory," Electron Devices Meeting, 2003. IEDM '03 Technical Digest. IEEE International , Dec. 8-10, 2003 pp.:7.5.1-7.5.4.

Chung, Steve S., "A Novel Leakage Current Separation Technique in a Direct Tunneling Regime Gate Oxide SONOS Memory Cell," Electron Devices Meeting, 2003. IEDM '03 Technical Digest. IEEE International , Dec. 8-10, 2003 pp.:26.6.1-26.6.4.

Lee, Chang Hyun, "A Novel SONOS Structure of SiO2/SiN/Al2O3/ with TaN Metal Gate for Multi-Giga Bit Flash Memeries," Electron Devices Meeting, 2003. IEDM '03 Technical Digest. IEEE International , Dec. 8-10, 2003, pp.:26.5.1-26.5.4.

Lee, Jae-Duk, et al., "Effects of Floating-Gate Interference and NAND Flash Memory Cell Operation," IEEE Electron Device Letters, vol. 23, No. 5, May 2002, 264-266.

Bude, J.D., et al. "Secondary Electron Flash—a High Performance, Low Power Flash Technology for 0.35 •m and Below," Electron Devices Meeting, 1997. Technical Digest., International , Dec. 7-10, 1997, 279-282.

Eitan, Boaz, et al. "NROM: A Novel Localized Trapping, 2-Bit Nonvolatile Memory Cell," IEEE Electron Device Letters, vol. 21, No. 11, Nov. 2000, 543-545.

Hirose, M., "Challenges for Future Semiconductor Development," Microprocesses and Nanotechnology Conference, 2002. Digest of Papers. Microprocesses and Nanotechnology 2002. 2002 International, Nov. 6-8, 2002, p 2-3, plus 24 pages from outline.

Huff, H.R. and Bevan, M., assemblers, "Questions at the International Workshop on Gate Insulators," Ad Hoc Meeting on High-k Gate Dielectrics at the Semiconductor Interface Specialists Conference, Nov. 30, 2001, 3 pages.

Tsai, W.J., et al., "Data Retention Behavior of a SONOS Type Two-Bit Storage Flash Memory Cell," Electron Devices Meeting, 2001. IEDM Technical Digest. International , Dec. 2-5, 2001 pp.:32.6.1-32.6.4.

Wang, Tahui, et al., "Reliability Models of Data Retention and Read-Disturb in 2-bit Nitride Storage Flash Memory Cells," Electron Devices Meeting, 2003. IEDM '03 Technical Digest. IEEE International , Dec. 8-10, 2003, pp.:7.4.1-7.4.4.

Yeh, C.C., et al., "PHINES: A Novel Low Power Program/Erase, Small Pitch, 2-Bit per Cell Flash Memory," Electron Devices Meeting, 2002. IEDM '02. Digest. International , Dec. 8-11, 2002, pp.:931-934.

Chang, Kuo-Tung, et al., "A New SONOS Memory Using Source-Side Injection for Programming," IEEE Electron Device Letters, vol. 19, No. 7, Jul. 1998, 253-255.

Eitan, Boaz, "Can NROM, a 2-bit, Trapping Storage NVM Cell, Give a Real Challenge to Floating Gate Cells?" SSDM, Tokyo, Japan (1999), 3 pages.

Fujiwara, I., et al., "0.13 μm MONOS single transistor memory cell with separated source lines," IEDM 1998, 995-998.

Kobayashi, T., et al., A Giga-Scale Assist-Gate (AG)-AND-Type Flash Memory Cell with 20-MB/s Programming Throughput for Content-Downloading Applications, IEDM 2001, 2.2.1-2.2.4.

Lusky, Eli et al., "Electron Discharge Model of Locally-Trapped Charge in Oxide-Nitride-Oxide (ONO) Gates for NROM Non-Volatile Semiconductor Memory Devices," SSDM, Tokyo, Japan (Sep. 2001), 2 pages.

Lusky, Eli et al., "Spatial characterization of Channel hot electrom injection Utilizing subthreshold slope of the localized charge storage NROM memory device," Non-Volatile Semiconductor Memory Workshop, Monterey, CA (Aug. 2001) 2 pages.

Naruke, K., et al. "A new Flash-Erase EEPROM Cell with a Sidewall Select-Gate on its Source Side, Nonvolatile Semiconductor Memories: Technologies, design and application," C. Hu. Ed., New York, IEEE Press, 1991, Ch. 5, pp. 183-186.

Sasago, Y, et al., "90-nm-node multi-level AG-AND type flash memory with cell size of true 2 F2/bit and programming throughput of 10 MB/s," IEEE, 2003, 4 pages.

U.S. Appl. No. 11/118,839 filed Apr. 29, 2005, "Inversion Bit Line, Charge Trapping Non-Volatile Memory and Method of Operating Same," 34 pages.

U.S. Appl. No. 11/085,444 filed Mar. 21, 2005, entitled "Method for Manufacturing a Multiple-Gate Charge Trapping Non-Volatile Memory," 71 pages.

U.S. Appl. No. 10/855,286 filed May 26, 2004, entitled "Nand-Type Non-Volatile Memory Cell and Method for Operating Same," 15 pages.

U.S. Appl. No. 11/085,458 filed Mar. 21, 2005, entitled "Charge Trapping Non-Volatile Memory and Method for Gate-by-Gate Erase for Same," 73 pages.

U.S. Appl. No. 11/085,325 filed Mar. 21, 2005, entitled "Memory Array Including Multiple-Gate Charge Trapping Non-Volatile Cells," 74 pages.

U.S. Appl. No. 11/085,326 filed Mar. 21, 2005, entitled "Charge Trapping Non-Volatile Memory with Two Trapping Locations per Gate, and Method for Operating Same," 73 pages.

U.S. Appl. No. 11/085,300 filed Mar. 21, 2005, entitled "Charge Trapping Non-Volatile Memory and Method for Operating Same," 73 pages.

Bude, J.D., et al. "Secondary Electron Flash - a High Performance, Low Power Flash Technology for 0.35 μm and Below," Electron Devices Meeting, 1997. Technical Digest International, Dec. 7-10, 1997, 279 - 282.

Eitan, Boaz, et al. "NROM: A Novel Localized Trapping, 2-Bit Nonvolatile Memory Cell," IEEE Electron Devices Letters, vol. 21, No. 11, Nov. 2000, 543-545.

Hirose, M., "Challenges for Future Semiconductor Development," Microprocesses and Nanotechnology Conference, 2002. Digest of Papers. Microprocesses and Nanotechnology 2002. 2002 International, Nov. 6-8, 2002, pp. 2-3, plus 24 pages from outline.

Huff, H.R. and Bevan, M., assemblers, "Questions at the International Workshop on Gate Insulators," Ad Hoc Meeting on High-k Gate Dielectrics at the Semiconductor Interface Specialists Conference, Nov. 30, 2001, 3 pages.

Tsai, W.J., et al., "Data Retention Behavior of a SONOS Type Two-Bit Storage Flash Memory Cell," Electron Devices Meeting, 2001. IEDM Technical Digest International, Dec. 2-5, 2001 pp. 32.6.1-32.6.4.

Yeh, C.C., et al., "Phines: A Novel Low Power Program/Erase, Small Pitch, 2-Bit per Cell Flash Memory," Electron Devices Meeting, 2002. IEDM '02. Digest International, Dec. 8-11, 2002, pp. 931-934.

Wang, Tahui, et al., "Reliability Models of Data Retention and Read-Disturb in 2-bit Nitride Storage Flash Memory Cells," Electron Devices Meeting, 2003. IEDM '03 Technical Digest. IEEE International, Dec. 8-10, 2003, pp. 7.4.1 - 7.4.4.

* cited by examiner

METHOD AND SYSTEM FOR SELF-CONVERGENT ERASE IN CHARGE TRAPPING MEMORY CELLS

RELATED APPLICATIONS

The present application claims priority to U.S. Provisional Application No. 60/565,377 filed 26 Apr. 2004. The present application also claims priority of U.S. Provisional Application No. 60/566,669 filed 30 Apr. 2004.

BACKGROUND OF THE INVENTION

1. Field of the Invention

The present invention relates to operating methods for electrically programmable and erasable non-volatile memory and integrated circuits including such memory, and more particularly to methods for establishing low threshold states and for correction and prevention of over-erase conditions in such devices.

2. Description of Related Art

Electrically programmable and erasable non-volatile memory technologies based on charge storage structures known as EEPROM and flash memory are used in a variety of modern applications. A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names NROM, SONOS, and PHINES, for example. These memory cell structures store data by trapping charge in a charge trapping dielectric layer such as silicon nitride. As negative charge is trapped, the threshold voltage of the memory cell increases. The threshold voltage of the memory cell is reduced by removing negative charge from the charge trapping layer.

One problem associated with EEPROM and flash memory cells is known as over-erase. The over-erase condition occurs when a biasing arrangement is applied to lower the threshold of the memory cell, where the low threshold state is considered the erase state of the cell. If the biasing arrangement establishes an amount of negative charge trapped in the charge storage element that is too low, then the threshold voltage of the memory cell will be too low, and the memory cell can leak current. Leakage current can interfere with successful operation of a memory array. The over-erase condition is one problem that has limited the scaling of charge trapping memory cell structures in the prior art.

Accordingly, it is desirable to provide an operating method for charge trapping memory cell structures in which over-erase is prevented.

SUMMARY OF THE INVENTION

The present invention provides an operating procedure and a memory architecture for charge trapping memory cells, which addresses the problem of over-erase.

In general, a method for operating a charge trapping memory cell is provided. The memory cell has a first channel terminal acting as a drain or source, a second channel terminal acting as a source or drain, a charge trapping structure and a gate terminal. The method for operating the memory cell includes establishing a high threshold state in the memory cell by injecting negative charge into the charge trapping structure to set a threshold voltage for the cell above a high state threshold. The method includes using a self-converging biasing procedure to establish a low threshold state for the memory cell by reducing the negative charge in the charge trapping structure to set the threshold voltage for the cell below a specified value for the low threshold state. The negative charge is reduced in the memory cell by applying a bias procedure including at least one bias pulse. The bias pulse induces injection of holes into the charge trapping layer and/or induces the ejection of electrons from the charge trapping layer, at a rate responsive to the amount of negative charge in the charge trapping structure during a bias pulse, and induces injection of electrons into (and/or holes out of) the charge trapping structure during the bias pulse when the amount of negative charge in the charge trapping structure is reduced sufficiently that the threshold voltage is near or below the low threshold state. In this manner, self-convergence occurs during the bias pulse by which the threshold voltage of the memory cell converges on a desired value, and an over-erase condition is avoided.

According to a first embodiment of the biasing procedure, a first bias is applied that induces hot hole injection into the charge trapping structure. The first bias pulse is based on a biasing arrangement including applying a negative voltage to the gate terminal and a positive voltage to the first channel terminal while the second channel terminal is grounded, in order to induce band-to-band tunneling induced hot hole injection. Under the biasing arrangement of the first bias pulse, some cells may suffer over-erase due to excess holes in the charge trapping structure. After the first bias pulse, a self-covering pulse is applied, according to a different biasing arrangement. The biasing arrangement of the second bias pulse in this first embodiment of the biasing procedure, includes applying a voltage to the gate terminal that has a relatively low absolute value as compared to the specified value for the low threshold state, such as in the range of −1 to +1 volts. A positive voltage is applied to the first channel terminal while the second channel terminal is grounded. Thus, the biasing arrangement of the second bias pulse includes a low gate bias with a high drain bias after a hot hole erase pulse. Since hot electrons and hot holes will inject simultaneously into the charge trapping structure when the threshold voltage of the cell converges on the specified value and under the biasing arrangement of the second pulse, a self-convergence is achieved.

According to a second embodiment of the biasing procedure, a first bias pulse is applied that induces hot hole injection as described for the first embodiment. A second bias pulse is applied after the first bias pulse based on a second biasing arrangement. The second biasing arrangement includes applying a reference voltage near ground to the semiconductor body in which the memory cell is formed. The first and second channel terminals are left floating, or biased to a reference voltage such as ground. A gate voltage is applied to the gate of the memory cell, which has a relatively high absolute value. The gate voltage according to this second biasing arrangement has an absolute value that is high enough to induce E-field assisted (Fowler-Nordheim) tunneling of electrons between the charge trapping layer, the gate terminal and the substrate depending on the amount of charge remaining in the charge trapping layer. Thus, for example, the gate voltage in one embodiment is about −14.5 volts. Electrons are injected from the gate electrode into the charge trapping layer, when the amount of negative charge in the charge trapping structure is low. Electrons stop tunneling or in some embodiments are ejected out of the charge trapping layer to the substrate, when the amount of negative charge in the charge trapping structure is near an amount that establishes the specified threshold voltage for the low threshold state. A balanced tunneling condition therefore occurs during which the cell converges on the specified value of the threshold voltage for the low threshold state. In other embodiments, during the second bias pulse the gate voltage is positive, and the balanced tunneling occurs in the opposite direction.

According to a third embodiment of the biasing procedure, a bias pulse is applied that induces self-converging hot hole injection according to a bias arrangement that includes a relatively low gate voltage, while the first channel terminal has a relatively high positive voltage, and the second channel terminal is grounded. In one embodiment, the gate voltage, according to the biasing arrangement of the third embodiment, is a negative voltage with absolute value less than 3 volts, while the first channel terminal receives a bias voltage of about +6 volts or higher. The specified value for the memory cell threshold in the low threshold state can be selected by the level of the gate voltage. In this condition, hot hole injection and hot electron injection occur simultaneously when the low threshold state is reached. Therefore, a self-converging erase pulse is provided, avoiding the over-erase condition.

The present invention is also embodied by integrated circuits including memory based on charge trapping memory cells, and control circuitry implementing the operating methods described above for the charge memory cells.

Other aspects and advantages of the present invention can be seen on review of the drawings, the detailed description and the claims, which follow.

DETAILED DESCRIPTION

A detailed description of embodiments of the present invention is provided with reference to FIGS. 1–11.

Figure 1:
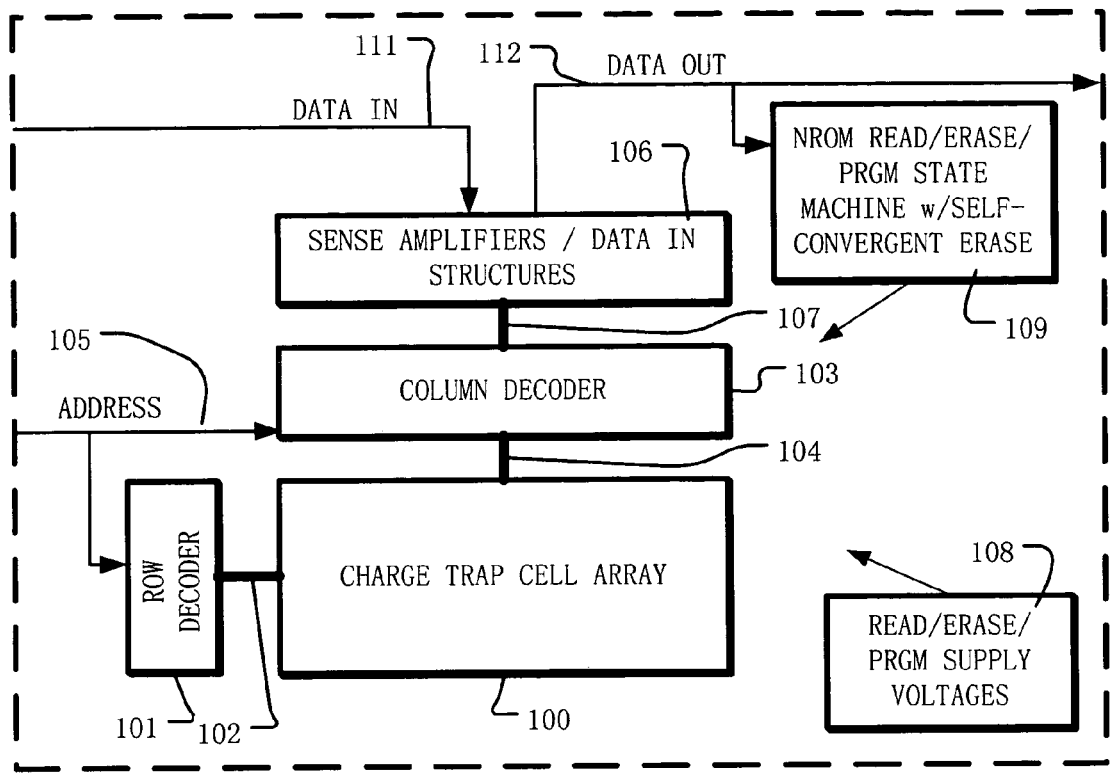
FIG. 1 is a simplified block diagram of an integrated circuit according to the present invention.

FIG. 1 is a simplified block diagram of an integrated circuit supporting self-convergent erase according to the present invention. The integrated circuit includes a memory array 100 implemented using NROM memory cells, or other charge trapping memory cells. A page-row decoder 101 is coupled to a plurality of word lines 102 arranged along rows in the memory array 100. A column decoder 103 is coupled to a plurality of bit lines 104 arranged along columns in the memory array 100. Addresses are supplied on bus 105 to column decoder 103 and page/row decoder 101. Sense amplifiers and data-in structures in block 106 are coupled to the column decoder 103 via data bus 107. Data is supplied via the data-in line 111 from input/output ports on the integrated circuit to the data-in structures in block 106. Data is supplied via the data-out line 112 from the sense amplifiers in block 106 to input/output ports on the integrated circuit.

Resources for controlling the reading, programming and erasing of memory cells in the array 100 are included on the chip. These resources include read/erase/program supply voltage sources represented by block 108, and the state machine 109, which are coupled to the array 100, the decoders 101, 103 and other circuitry on the integrated circuit, which participates in operation of the device.

The supply voltage sources 108 are implemented in various embodiments using charge pumps, voltage regulators, voltage dividers and the like as known in the art, for supplying various voltage levels, including negative voltages, used in the read, erase and program operations.

The state machine 109 supports read, erase and program operations, including self-convergent erase according to the present invention. According to some embodiments, the erase process includes an erase verifying procedure. According to the erase verify procedure, a signal is generated indicating whether the threshold of a memory cell has reached as erase verify threshold. After the memory cell has reached an erase verify threshold, no further erase pulse is need to be applied to the memory cell. The state machine 109 can be implemented using special-purpose logic circuitry as known in the art. In alternative embodiments, the state machine 109 is implemented using a controller that comprises a general-purpose processor, which may be implemented on the same integrated circuit, which executes a computer program to control the operations of the device. In yet other embodiments, a combination of special-purpose logic circuitry and a generally-purpose processor may be utilized for implementation of the state machine.

Figure 2:
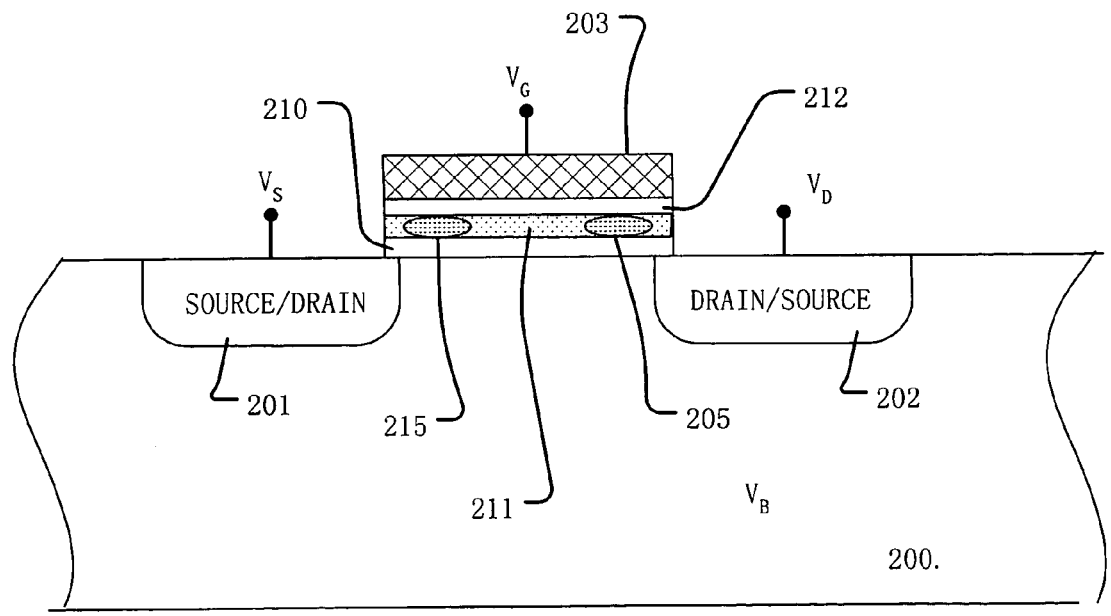
FIG. 2 illustrates a conventional charge trapping memory cell as known in the prior art.

FIG. 2 is a simplified diagram of a prior art charge trapping memory cell, such as an NROM cell suitable for use in an integrated circuit as shown in FIG. 1. The memory cell is implemented in a semiconductor substrate 200. The cell includes a source 201 and a drain 202 formed by respective diffusion regions, separated by a channel in the substrate 200. A control gate 203 overlies the channel. Channel lengths in representative embodiments are 0.25 microns and less, as minimum feature sizes scale downward in integrated circuit manufacturing. A charge storage element 211 is isolated by an insulator such as silicon dioxide or silicon oxynitride 210 between the control gate 203 and the channel, typically having a thickness in the range of 30 to above 120 Angstroms depending on the operating arrangement selected, although other dielectric dimensions are applied for some memory cell embodiments. The charge storage element 211 comprises silicon nitride in a nitride MOS memory cell like an NROM cell or a SONOS cell. In other embodiments, other charge trapping material, such as $Al_2O_3$, $HfO_x$, $ZrO_2x$, or other metal oxides can be used to form memory cells. The charge trapping layer can be continuous across the length of the channel as shown, or can consist of multiple isolated pockets of charge trapping material. Negative charge symbolized by charge traps 205, 215 is trapped in the charge trapping layer, in response to hot electron injection, Fowler-Nordheim tunneling, and/or direct tunneling in various program procedures.

In order to program the memory cell, control circuitry on the integrated circuit applies a source voltage $V_S$ to the source 201 such as ground, a drain voltage $V_D$ to the drain 202 such as +3 to +5 volts, a gate voltage $V_G$ to the control gate 203 such as +6 to +12 volts, and a substrate voltage $V_B$ to the substrate 200 such as ground, which together provide an example of a biasing arrangement that injects negative charge in the form of electrons into the charge trapping layer 211, raising the threshold voltage VT of the memory cell above a specified program threshold. Other procedures, including direct tunneling and E-field assisted tunneling can be used for establishing a high threshold state. In order to erase the cell, a different biasing arrangement is applied to inject holes eliminating the electrons or to otherwise remove the electrons from the charge trapping layer, lowering the VT below a specified erase threshold. Data is read from the memory cell by applying a source voltage $V_S$ to the source 201, such as ground, a drain voltage $V_D$ to the drain 202 such as +2 volts, a gate voltage $V_G$ to the control gate 203 which has a specified read threshold value above the erase threshold and below the program threshold. Over-erase is a condition in which the charge in the charge trapping layer has a positive net voltage, for example, or other charge value in which the VT is too low, causing the memory cell to leak current, when a low voltage, such as ground or a voltage less than the specified erase threshold, is applied to the gate. As illustrated in FIG. 2, the memory cell can store one or more bits of data on each of the left charge trapping region 215 and right charge trapping region 205 of the charge trapping structure 211. Typically, an NROM memory cell is programmed in a first "direction" with the first channel terminal 201 set at a voltage such as +5 to +6 volts, and the second channel terminal 202 set at ground, while the gate receives about +6 volts. The memory cell is then read in a reverse direction, where the first channel terminal 201 is grounded, and the second channel terminal 202 is set at a voltage such as +2 or +3 volts, while the gate receives a read potential. The opposite side of the memory cell is programmed and erased with the biasing arrangements set up in the opposite direction.

Figure 3A:
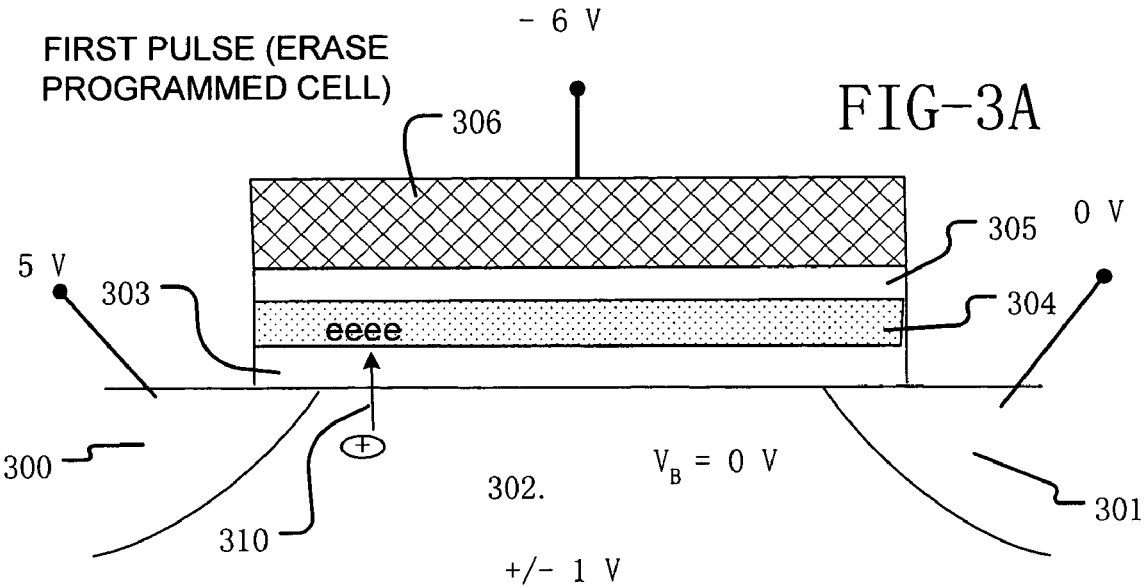
FIGS. 3A–3C illustrates two-pulse, self-convergent erase procedure, according to the timing diagram in FIG. 4.
Figure 3B:
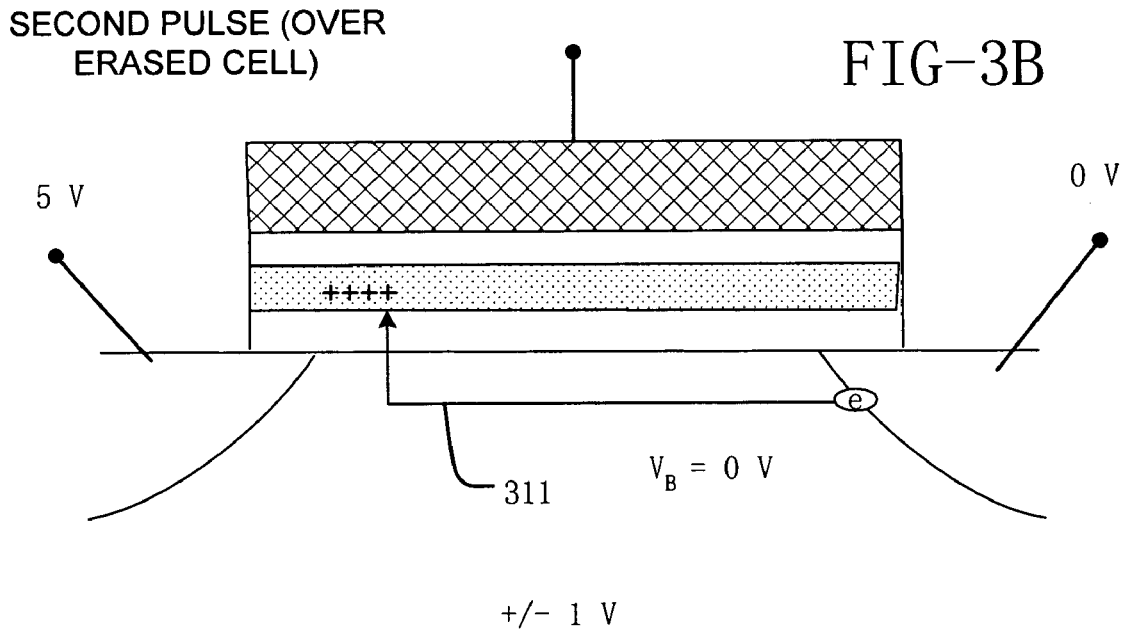
Figure 3C:
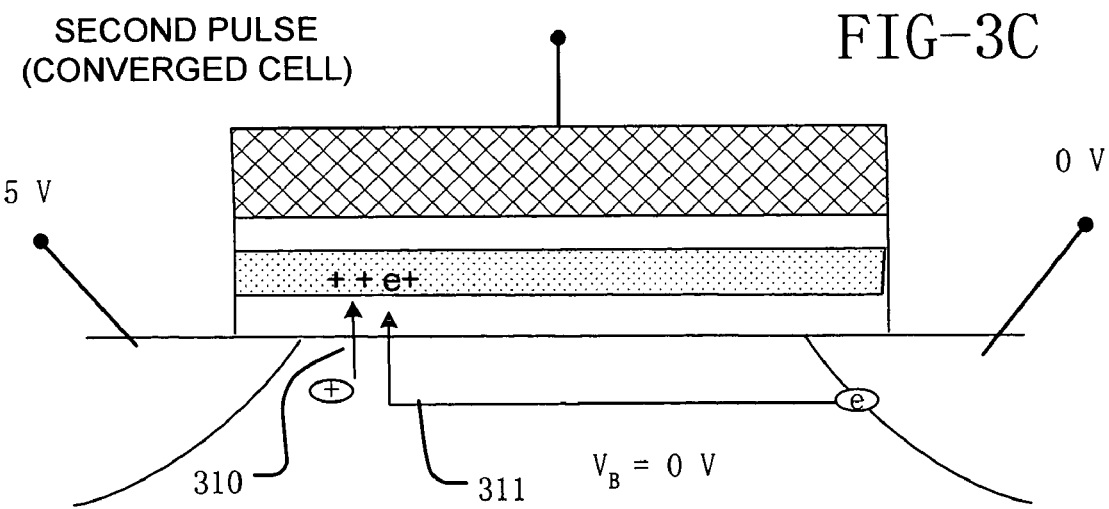

FIGS. 3A–3C illustrate a biasing arrangement for establishing a low threshold state, which corresponds with an erase state in typical embodiments, in a charge trapping memory cell. FIG. 3A heuristically illustrates a memory cell including a first channel terminal 300 and a second channel terminal 301 and a substrate, with a channel region 302 between them. A tunnel dielectric 303 overlies the substrate in the channel region 302. A charge trapping layer 304 overlies the tunnel dielectric 303. A top dielectric 305 overlies the charge trapping layer 304. A gate terminal 306 overlies the top dielectric 305. Charge trapped in the charge trapping layer 304 affects the thresholds voltage for the memory cell.

In FIG. 3A, negative charge ("e") is trapped on the left side of the charge trapping layer. According to the biasing arrangement illustrated, negative charge in the charge trapping layer is reduced to set the threshold voltage for the cell below a specified value for the low threshold state. The negative charge is reduced by applying a biasing procedure including a first bias pulse as shown in the block 400 of FIG. 4, which induces injection of holes "+" into the charge trapping layer, by band-to-band tunneling induced hot hole injection.

Figure 4:
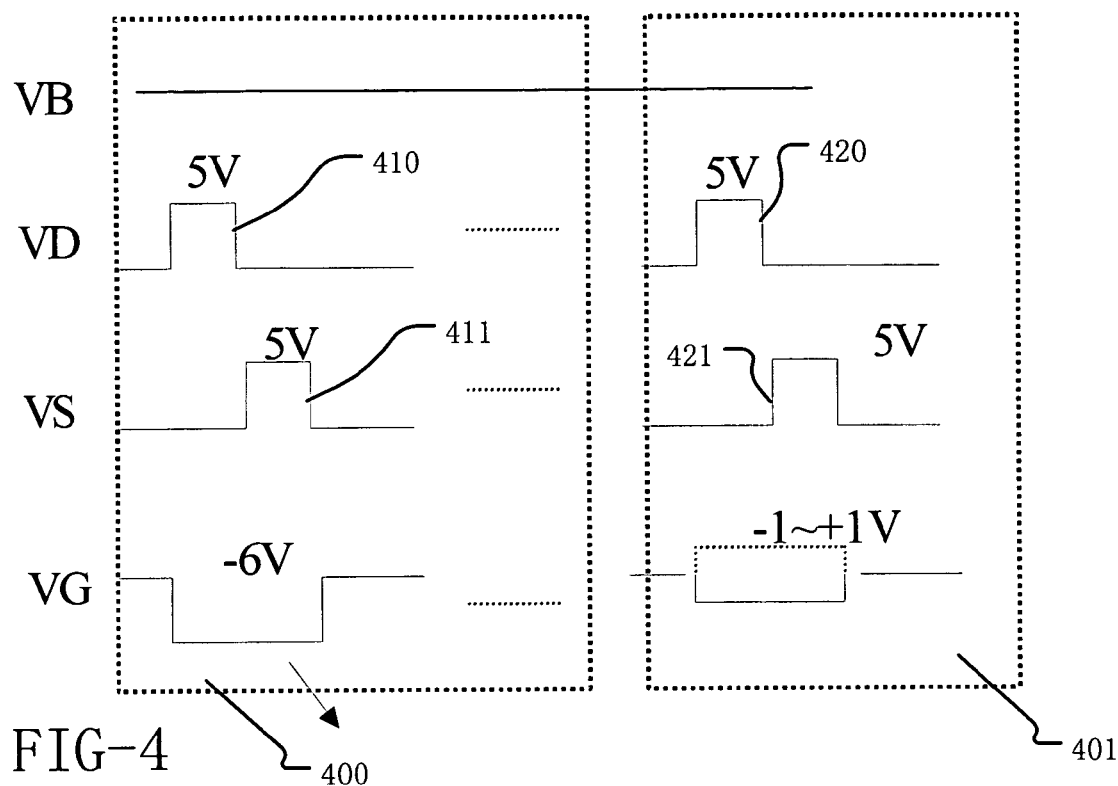
FIG. 4 is a timing diagram illustrating potentials applied in a self-convergent erase procedure according to embodiments of the present invention.

With reference to FIG. 4, the biasing procedure includes applying a reference voltage such as ground to the substrate VB. A first channel terminal 300 corresponds with the drain and receives the voltage VD. The second channel terminal 301 corresponds with the source and receives the voltage VS. The gate terminal of the memory cell receives the voltage VG. According to the first pulse of the biasing procedure of FIG. 4, the voltage VD is raised to the level of about +5 volts for a program interval as illustrated at time 410. The gate voltage VG during this interval is lowered to voltage level between about −3 volts and about −8 volts, such as for example −6 volts as illustrated. The source voltage VS during this interval remains at ground. The magnitude of the drain voltage VD must be high enough to induce hot hole injection. The opposite side of the memory cell receives a similar pulse, during interval 411, in which the source voltage VS is raised to a level of about +5 volts, while the drain voltage VD is ground. The gate voltage VG remains at the level about −6 volts during the interval 411. The biasing arrangement shown in block 400 results in band-to-band tunneling induced hot holes (represented by the arrow 310) which are injected through the tunnel dielectric 300 eliminating electrons in the charge trapping layer 304, and reducing the amount of negative charge trapped.

As symbolized in FIG. 3B by the excess holes "+" in the charge trapping layer, over-erase can occur in some memory cells in an array after the first pulse. Following a first pulse as shown in block 400, a second bias pulse is applied as illustrated in block 401 of FIG. 4. The second bias pulse has a self-converging behavior, with separate pulse for the left and right side of the memory cell. According to the first pulse of the biasing procedure of FIG. 4, the voltage VD is raised to the level of about +5 volts for a program interval as illustrated at time 420. The gate voltage VG during this interval is set to a level in a range of about −1 to about +1 volts, which is low relative to the specified value of the threshold for the low threshold state. The source voltage VS during this interval remains at ground. The opposite side of the memory cell receives a similar pulse, during interval 421, in which the source voltage VS is raised to level of about +5 volts, while the drain voltage VD is ground. The gate voltage VG remains set to a level in a range of about −1 to about +1 volts during the interval 421.

As illustrated in FIG. 3B, channel hot electron injection represented by arrow 311 is induced during the second pulse for an over-erased cell, tending to balance the charge in the charge trapping layer to a level causing the desired threshold value. As illustrated in FIG. 3C, when the charge is balanced, and the threshold has converged on a desired value, both hot electron injection (311) and hot hole injection (310) may occur tending to balance the amount of charged trapped in the converged cell, and prevent the threshold from shifting away from the desired value.

The low threshold state for the memory cell will have a specified value for the threshold voltage. The self-converging pulse can be modified to match the specified value by varying the gate voltage. The precise values of the gate voltage, and the source and drain voltages needed for a particular memory cell depend on a number of factors, including the characteristics of the tunnel and charge trapping dielectrics, the size of the memory cell, the materials used in the gate of the memory cell, and so on.

The second pulse 401 illustrated in FIG. 4 can be applied after each erase pulse as shown in block 400, or after a successful erase verify operation following an erase pulse. Thus, in some embodiments applying the biasing procedure of FIG. 4, no erase verify operation is executed. In other embodiments, an erase verify is executed after the first pulse in the biasing procedure. In this case, if the signal is generated indicating that the memory cell has been successfully erased, then the self-converging second pulse is applied, else the first pules as repeated. In other cases, the erase verify is executed after the second pulse in the biasing procedure. In this case, if the signal is generated indicating that there has not been successful erase, then the erase procedure is repeated, including the first and second pulses.

Figure 5:
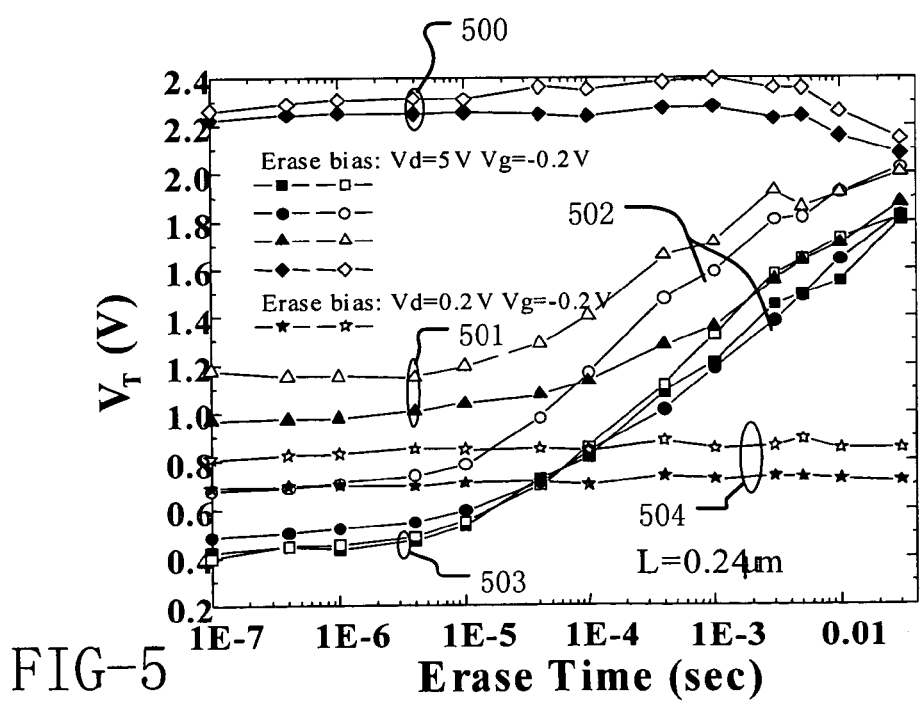
FIG. 5 is a graph of threshold voltage versus pulse time for the second pulse of the bias arrangement of FIG. 4.

FIG. 5 is a graph illustrating the self-convergence behavior under the bias conditions during the second pulse shown in block 401. The graph shows traces 500 for two memory cells starting with a threshold voltage of about +2.2 volts, the threshold voltage of the memory cell converges on about +2 volts. Traces 501 illustrate behavior of two memory cells starting with threshold voltage of about +1.0 and +1.2 volts, respectively. Again, after the self-converging pulse, the threshold voltage of the memory cells is converging on a level of about +2 volts. Traces 502 illustrate the behavior of memory cells with a starting threshold of about +0.5 and +0.7 volts, respectively. Traces 503 illustrate behavior of memory cells with a starting threshold of about +0.4 volts. As can be seen, the threshold voltage for the memory cells with starting thresholds between about +2.3 and about +0.4 volts converge on a target threshold voltage after the self-converging pulse. The traces 504 illustrate the behavior of an unselected memory cell during the self-converging pulse, where the drain voltage is maintained at a low level, in this example about +0.2 volts. As can be seen, the unselected memory cells are not disturbed by this process.

Figure 6A:
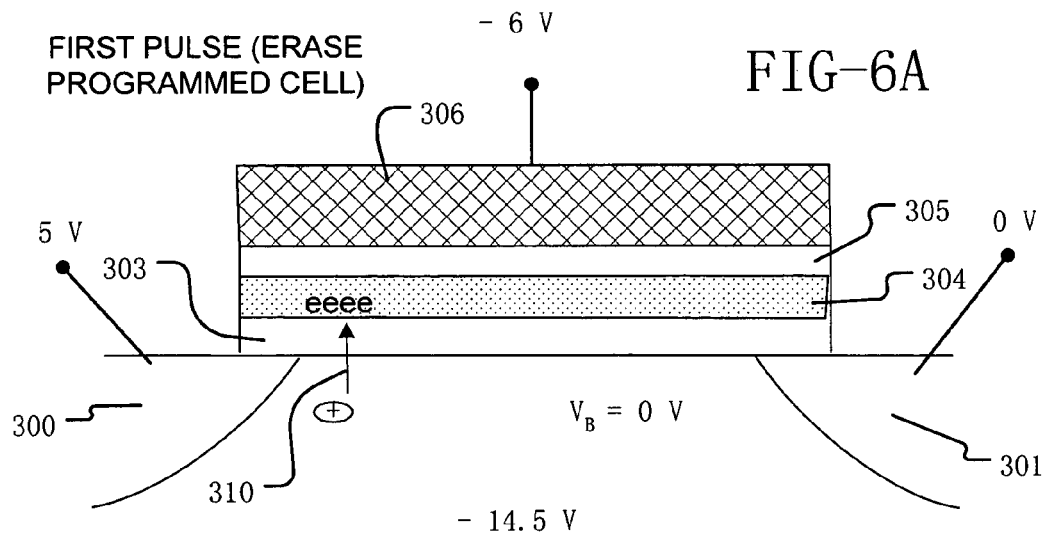
FIGS. 6A–6C illustrate a two-pulse, self-convergent erase procedure, according to the timing diagram in FIG. 7.
Figure 6B:
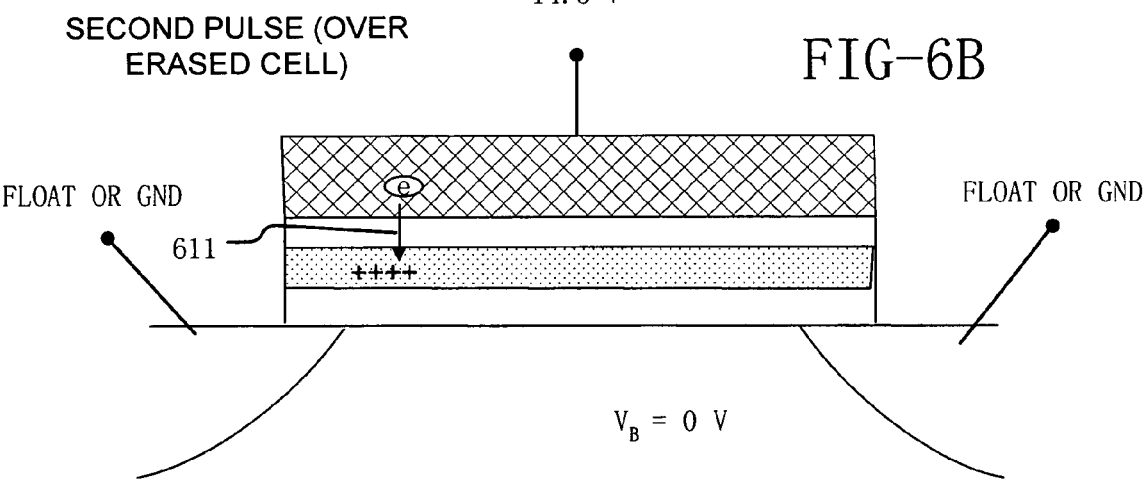
Figure 6C:
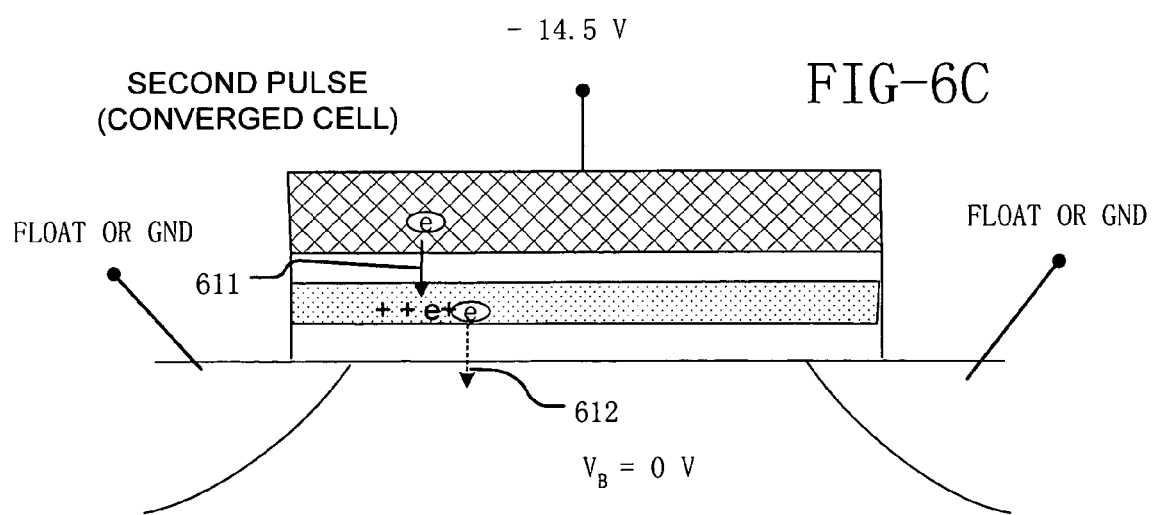
Figure 7:
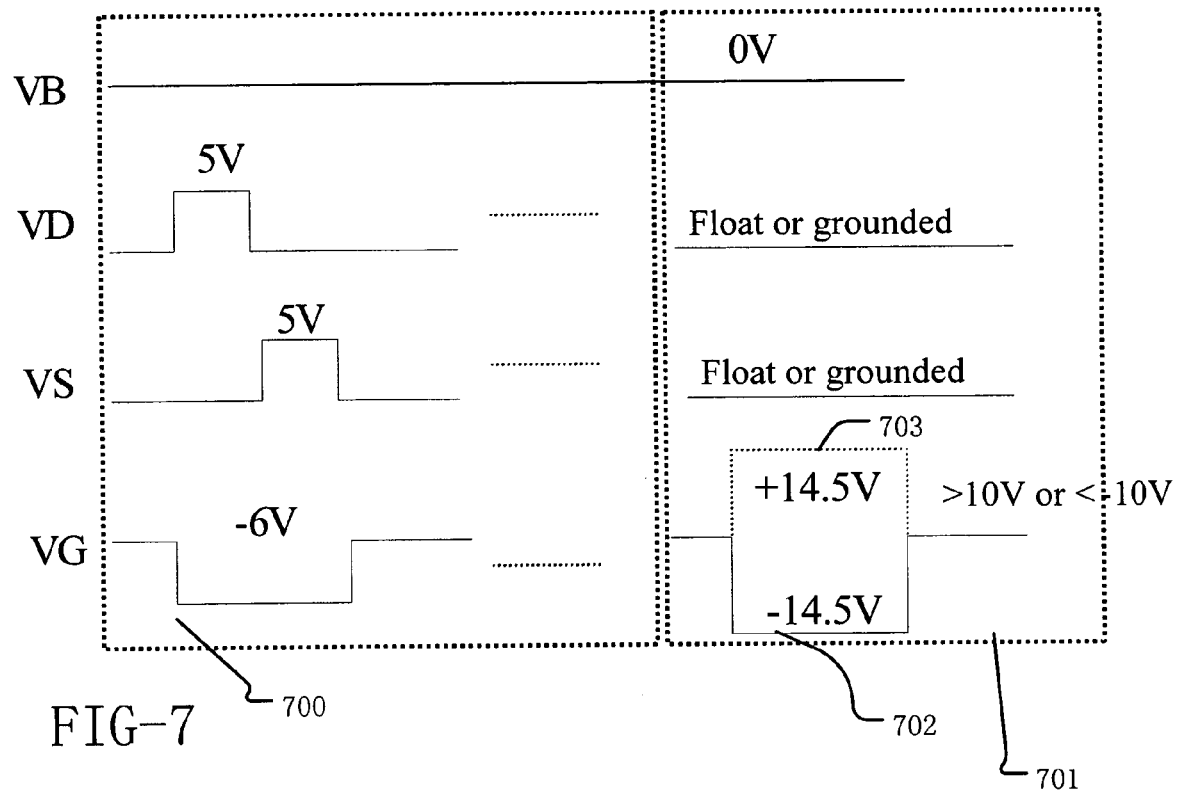
FIG. 7 is a timing diagram illustrating potentials applied in a self-convergent erase procedure according to embodiments of the present invention.

FIGS. 6A–6C illustrate an alternative biasing arrangement for establishing a low threshold state, according to the bias procedure shown in FIG. 7. According to the first pulse the shown in block 700 of FIG. 7, hot hole injection (310) is induced to reduce the threshold of the cell, as discussed above with respect to FIG. 3A and block 400 of FIG. 4. The second pulse according to the bias procedure is illustrated in block 701 of FIG. 7. In the second pulse in block 701 of FIG. 7, the bulk voltage VB is set to 0 volts or ground, the drain voltage VD is grounded or left floating and the source voltage VS is grounded or left floating. The gate voltage VG is set to a relatively high absolute value in the pulse interval. In one embodiment, the gate voltage VG is set to −14.5 volts on trace 702 of FIG. 7, and as shown in FIG. 6B and FIG. 6C. In an alternative, the gate voltage VG is set to a +14.5 volts as shown on trace 703 of FIG. 7. The biasing arrangement in block 701 results in counterbalancing Fowler-Nordheim tunneling between the gate and charge trapping layer, and between the charge trapping layer and substrate. The precise level of the gate voltage can be varied as suits the needs of a particular implementation of the memory cell, as necessary to achieve the self-converging effect. According to the present invention it is believed that the gate voltage within absolute value in a range of about 10 to about 20 volts will achieve the self-converging effect.

FIG. 6B illustrates the conditions in which a memory cell is over-erased after the first pulse 700. In this case, with the gate voltage at −14.5 volts, electrons tunnel from the gate to the charge trapping structure as symbolized by arrow 611. The injected electrons tend to correct an over-erase condition. As illustrated in FIG. 6C, as the negative charge in the charge trapping layer reaches a level causing the specified value of threshold voltage for the erase condition, electrons stop tunneling or in some embodiments, can tunnel out of the charge trapping layer to the substrate as symbolized by the arrow 612. Thus the second pulse induces electron tunneling from the gate to the charge trapping layer that converges on a stable condition, or is balanced by tunneling from the charge trapping layer to the channel, when the pulse is negative, and induces electron tunneling from the channel to the charge trapping layer that converges on a stable condition or is balanced by tunneling from the charge trapping layer to the gate, when the pulse is positive. The second pulse in this embodiment, affects both the left and the right side of the memory cell simultaneously. The amplitude of the gate voltage for the second pulse can be varied as meets the needs of a specific embodiment of the memory cell. Typically, the gate voltage will have an absolute value greater than 10 volts, and in a range of about 10 to 15 volts or higher, for example, to achieve convergence to within an acceptable range of a specified threshold voltage in a reasonable interval time. In some embodiments, the second pulse has a pulse width of about 1 millisecond to about 100 milliseconds.

The second pulse in block 701 of FIG. 7 can be applied after each erase pulse as shown in block 700, or after a successful erase verify operation following an erase pulse.

Figure 8:
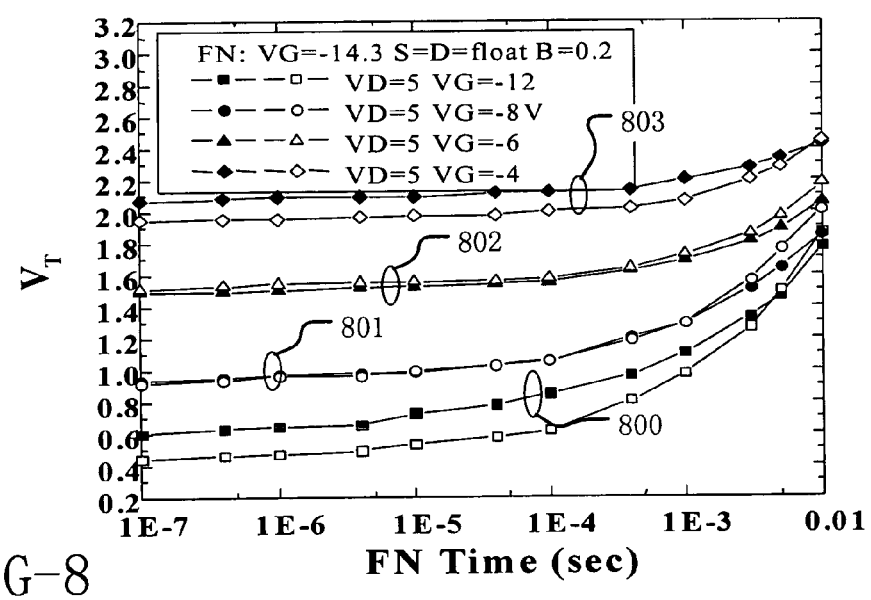
FIG. 8 is a graph of threshold voltage versus pulse time for the second pulse of the bias arrangement of FIG. 7.

FIG. 8 illustrates the self-convergence behavior under the bias conditions of block 701, with four different starting conditions. The threshold voltages for a pair of memory cells is shown on trace 800, after being erased by hot hole injection with a gate voltage of —12 volts and a drain voltage of +5 volts. As can be seen, the starting threshold voltage was about +5 volts. After the self-converging pulse with −14.3 volts on the gate, the source and drain floating and the substrate set to about +0.2 volts, the threshold voltage converges on about +1.6 volts after 10 milliseconds. For memory cells shown on trace 801, after being erased within negative eightfold gate voltage, the starting threshold voltage was about one volt, and the threshold voltage after about 10 milliseconds of the self-converging pulse was about +1.6 volts. For memory cells shown on trace 802, after being erased within −6.0 volts on the gate, the starting threshold voltage is about +1.5 volts, and the converged threshold is about +1.8 volts. For the pair of memory cells programmed with a gate voltage at −12 volts on trace 803, the starting threshold voltage was about +2.0 volts, and the self-converge to threshold voltage was about +2.2 volts. Thus, convergence of the threshold voltage for the memory cell is achieved using a pulse as shown in block 701 of FIG. 7.

Figure 9A:
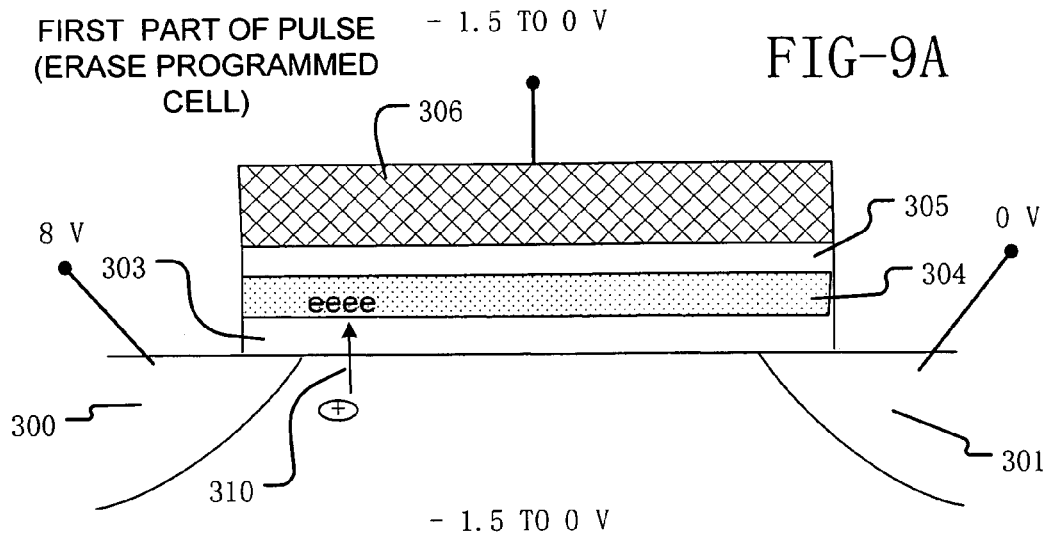
FIGS. 9A–9C illustrate a one-pulse, self-convergent erase procedure, according to the timing diagram in FIG. 10.
Figure 9B:
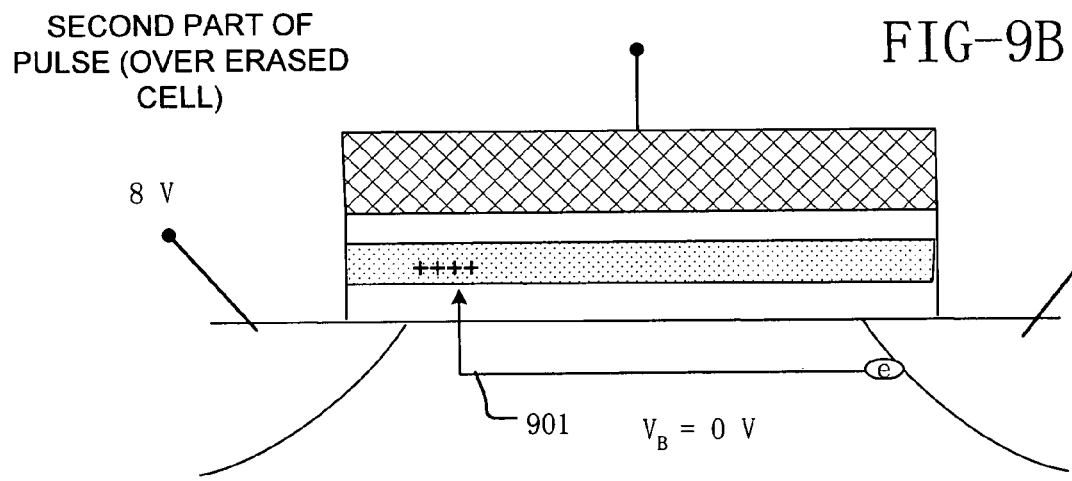
Figure 9C:
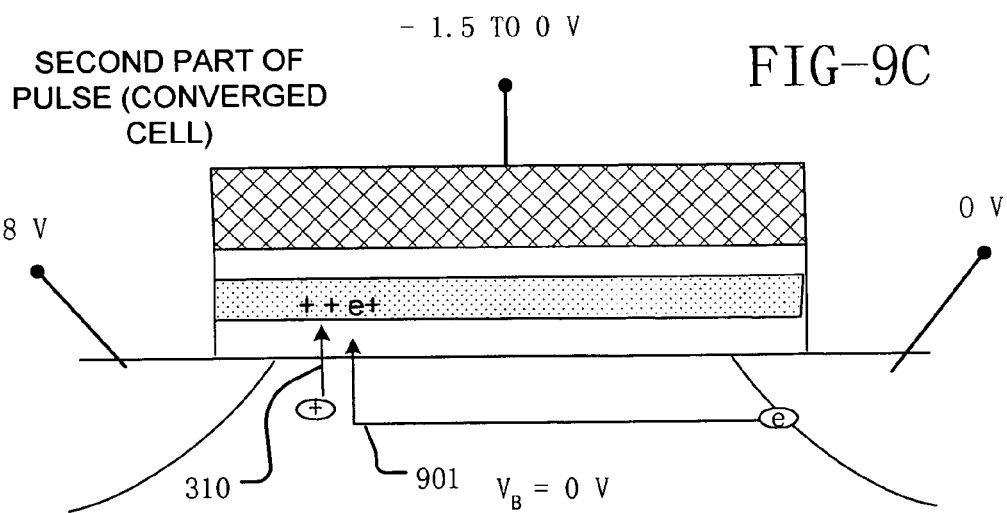
Figure 10:
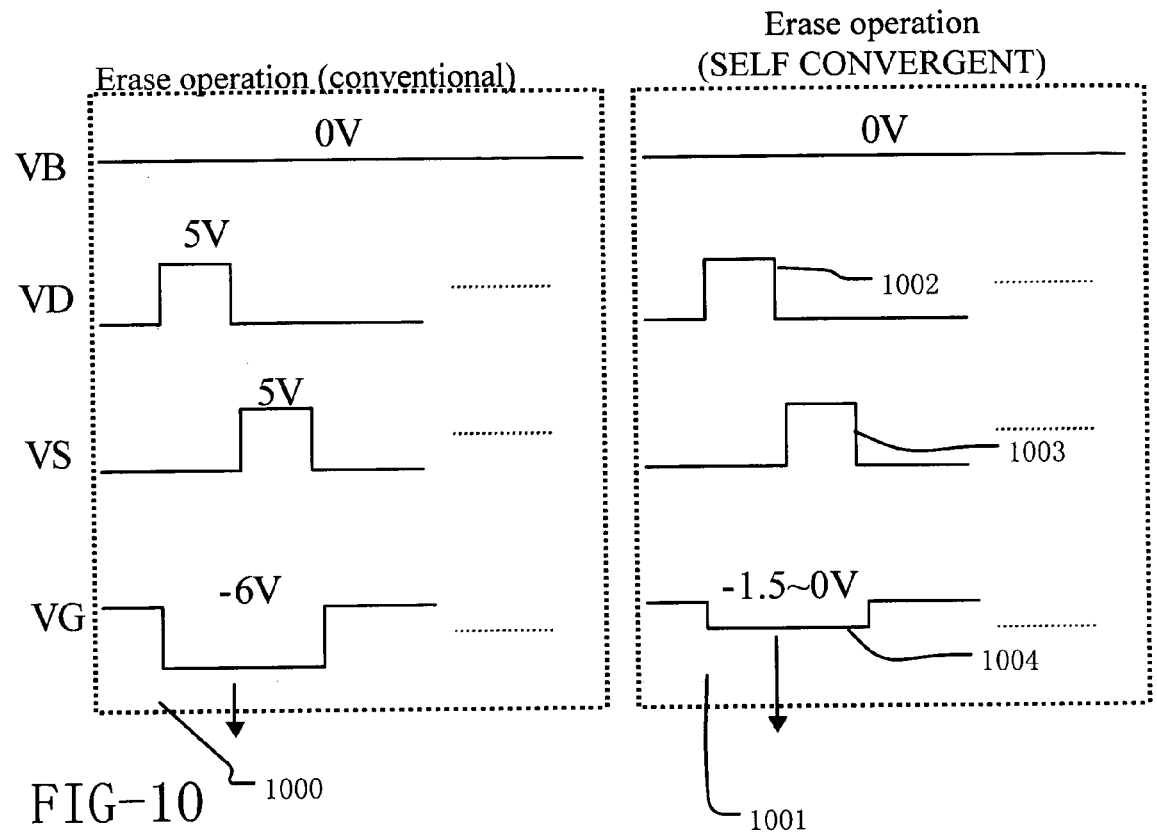
FIG. 10 is a timing diagram illustrating potentials applied in a self-convergent erase procedure according to embodiments of the present invention.

FIGS. 9A–9C illustrate yet another biasing arrangement for self-converging erase according to the present invention, using a single bias pulse as illustrated in FIG. 10. In FIG. 10, the first block 1000 illustrates the conventional hot hole injection arrangement which is like the first pulse in the first and second erase procedures illustrated above. In this case, the pulse of block 1000 is not applied. Rather, a self-converging pulse as shown in block 1001 is applied with the drain voltage VD for programming the left side set at a value during the interval 1002 higher than +5 volts, such as about +8 volts, the source voltage VS left at ground, and the gate voltage VG for example between zero and −1.5 volts to cause self-convergence. The drain voltage VD is increased relative to the conventional hot hole injection in the biasing arrangement of block 1000 to improve the speed of operation. To program the right side of the memory cell, the source voltage VS is pulsed during interval 103, while the drain voltage VD is left grounded. The specified value of the threshold voltage for the erase state can be achieved by adjusting the gate voltage VG so that convergence occurs at the specified value. According to this embodiment, gate voltage VG is low relative to the specified value. According to this embodiment, gate voltage VG is low relative to the specified value in order to achieve self convergence.

As shown in FIG. 9A, a programmed cell with negative charge trapped in the charge trapping layer, establishing a high threshold, is erased by hot hole injection symbolized by arrow 310, that occurs under the bias arrangement of the pulse during interval 1002. During a second part of the pulse interval 1002 as shown in FIG. 9B, the cell may approach an over-erase condition in which the channel conducts electrons. In this case, hot electron injection symbolized by arrow 901, is induced by current flowing in the channel. Self-convergence is illustrated in FIG. 9C, when hot electron injection 901 and hot hole injection 310 are balanced.

Figure 11:
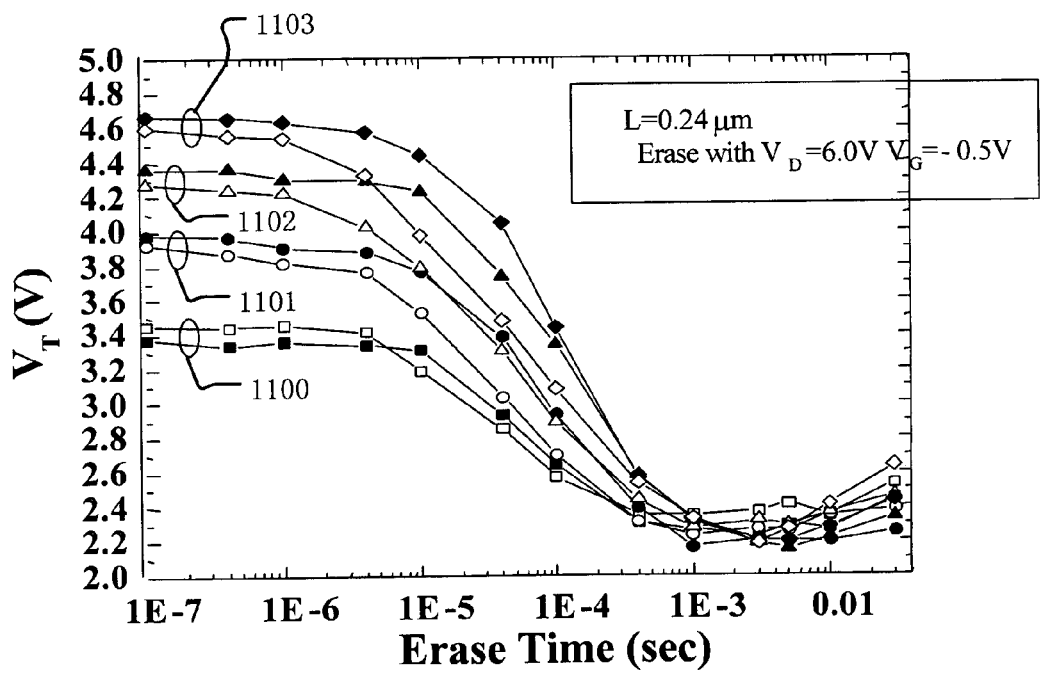
FIG. 11 is a graph of threshold voltage versus pulse time for the self-convergent pulse of the bias arrangement of FIG. 10.

FIG. 11 is the graph illustrating the self-convergence behavior for the biasing arrangement of FIG. 10 for four pairs of memory cells, with channel lengths of about 0.24 microns, with different program threshold starting states. The first pair 1100 has a starting threshold of about +3.5 volts. After about one millisecond of erase pulse with a drain voltage of +6 volts and a gate voltage of −0.5, the thresholds of the memory cells converge on about +2.4 volts. The second pair 1101 has a starting threshold of about +4 volts, and likewise converges on about +2.4 volts after about one millisecond. The third pair 1102 has a starting threshold of about +4.4 volts, and converges on a threshold about +2.4 volts after about one millisecond. The last pair 1103 has yet a higher starting threshold of about +4.7 volts, and converges on the same +2.4 volt threshold after about one millisecond. Thus, over a wide range of starting thresholds for the self-converging biasing arrangement of FIG. 10, the erase pulse causes convergence on a common threshold. The level of the threshold can be adjusted by adjusting the magnitude of the gate voltage, and other characteristics of the memory cells.

Figure 12:
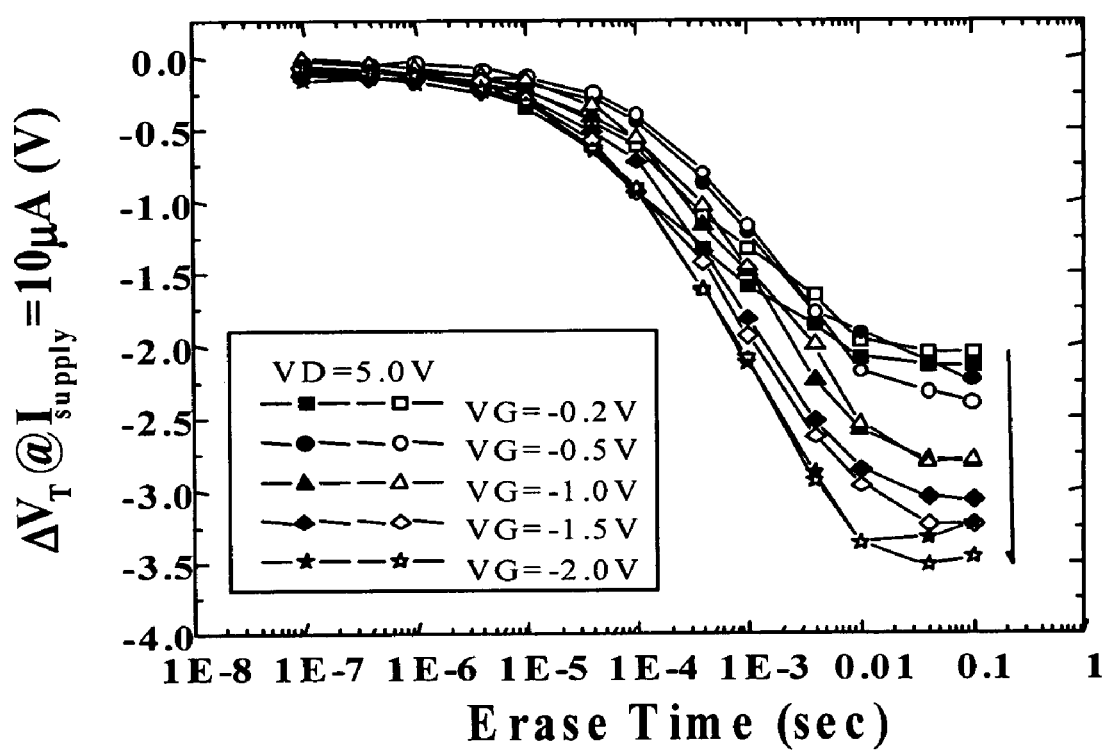
FIG. 12 is a graph of change in threshold voltage versus pulse time for the self-convergent pulse of the bias arrangement of FIG. 10.

FIG. 12 is a graph illustrating the dependence on gate voltage gatefold age (what is gate) of the threshold voltage shift caused by a biasing pulse as shown in FIG. 10. The graph illustrates that for a gate voltage of −0.2 volts the threshold change of about −2 volts is induced after about one hundred milliseconds. The threshold change increases in magnitude with increasing gate voltage during the pulse. Thus, for a gate voltage of about −2.0 volts, the threshold shift is about −3.5 volts after one hundred milliseconds.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for operating a charge trapping memory cell, the memory cell having a first channel terminal acting as a drain or source, a second channel terminal acting as a source or drain, a charge trapping structure and a gate terminal, the method comprising:

establishing a high threshold state in the memory cell by injecting negative charge into the charge trapping structure to set a threshold voltage for the cell above a high state threshold; and establishing a low threshold state in the memory cell by reducing the negative charge in the charge trapping structure to set the threshold voltage for the cell below a specified value for the low threshold state, by applying a bias procedure including a first stage which reduces negative charge in the charge trapping structure at a rate responsive to the amount of negative charge in the charge trapping structure when the amount of negative charge in the charge trapping structure is above the low state threshold, and a second stage which increases negative charge in the charge trapping structure pulse when the amount of negative charge in the charge trapping structure is below the low state threshold, causing convergence of the threshold voltage in the low threshold state toward the specified value.

2. The method of claim 1, wherein the bias procedure includes:

applying a first bias pulse according to a first bias arrangement inducing hot hole injection into the charge trapping structure to set a threshold voltage in the memory cell to a low threshold state, the first biasing arrangement including applying a negative voltage to the gate terminal and positive voltage to the first channel terminal, while the second channel terminal is grounded; and applying a second bias pulse according to a second bias arrangement causing convergence of the threshold voltage toward the specified value, the second biasing arrangement including applying a low voltage relative to the specified value to the gate terminal, applying a positive voltage to the first channel terminal and grounding the second channel terminal, wherein the positive voltage on the first channel terminal is high enough to injection electrons into the charge trapping structure when the threshold voltage is low relative to the specified value, and to cause injection of holes into the charge trapping structure when the threshold is high relative to the specified value.

3. The method of claim 2, including after applying the first bias pulse according to the first biasing arrangement, providing a signal indicating whether the memory cell passes or fails verification of whether the threshold voltage is below a low threshold verify voltage; and then if the memory cell passes verification, then applying the second bias pulse according to the second biasing arrangement in response to the signal.

4. The method of claim 3, including after applying the first bias pulse according to the first biasing arrangement, and applying the second bias pulse according to the second biasing arrangement in response to the signal, then providing a signal indicating whether the memory cell passes or fails verification of whether the threshold voltage is below a low threshold verify voltage; and then if the memory cell fails verification, then applying another bias pulse according to the first biasing arrangement.

5. The method of claim 3, including after applying the first bias pulse according to the first biasing arrangement, and applying the second bias pulse according to the second biasing arrangement in response to the signal, then providing a signal indicating whether the memory cell passes or fails verification of whether the threshold voltage is below a low threshold verify voltage; and then if the memory cell fails verification, then applying another pulse according to the first biasing arrangement followed by another pulse according to the second biasing arrangement.

6. The method of claim 2, wherein the negative voltage on the gate terminal, according to the first biasing arrangement, has an absolute value of about 3 volts or higher, and the positive voltage on the first channel terminal, according to the first biasing arrangement, has an absolute value of about 5 volts or higher.

7. The method of claim 2, wherein the positive voltage on the first channel terminal, according to the first biasing arrangement, has an absolute value of about 5 volts or higher.

8. The method of claim 2, wherein the positive voltage on the first channel terminal, according to the second biasing arrangement, has an absolute value of about 5 volts or higher, and the low voltage applied to the gate terminal, according to the second biasing arrangement is in a range from about −1.5 volts to +1.5 volts.

9. The method of claim 2, wherein the low voltage applied to the gate terminal, according to the second biasing arrangement is in a range from about −1.5 volts to +1.5 volts.

10. The method of claim 2, wherein the low voltage applied to the gate terminal, according to the second biasing arrangement is in a range from about −1.5 volts to about ground.

11. The method of claim 1, wherein the bias procedure includes:
applying a bias pulse according to a first bias arrangement including hot hole injection into the charge trapping structure to set a threshold voltage in the memory cell to a low threshold state, the first biasing arrangement including applying a negative voltage to the gate terminal and positive voltage to the first channel terminal, while the second channel terminal is grounded, the negative voltage applied to the gate terminal having an absolute value of less then 3 volts, and the positive voltage applied to the first channel terminal having an absolute value high enough to induce hot hole injection while the threshold voltage of the cell is greater than the specified value and to induce hot electron injection when the threshold voltage of the cell is near to the specified value in order to suppress overshoot of the specified voltage.

12. The method of claim 11, including after applying the bias pulse according to the first biasing arrangement, then providing a signal indicating whether the memory cell passes or fails verification of whether the threshold voltage is below a low threshold verify voltage; and then the memory cell fails verification, then applying another pulse according to the first biasing arrangement.

13. The method of claim 11, wherein the negative voltage on the gate terminal, according to the first biasing arrangement, has an absolute value of about 1.5 volts or less, and the positive voltage on the first channel terminal, according to the first biasing arrangement, has an absolute value of abut 6 volts or more.

14. The method of claim 1, wherein the bias procedure includes:
applying a first bias pulse according to a first bias arrangement inducing hot hole injection into the charge trapping structure to set a threshold voltage in the memory cell to a low threshold state, the first biasing arrangement including applying a negative voltage to the gate terminal and positive voltage to the first channel terminal, while the second channel terminal is grounded; and
applying a second bias pulse according to a second bias arrangement causing convergence of the threshold voltage in the low threshold state toward a specified value, the second biasing arrangement including applying a reference voltage near ground to the semiconductor body, applying a low voltage near ground or floating the first channel terminal, applying a low voltage near ground or floating the second channel terminal, and applying a gate voltage to the gate terminal, wherein the gate voltage has an absolute value high enough that when the threshold voltage is low relative to the specified value to change the threshold voltage to a value nearer to the specified value, and low enough that when the threshold voltage is near the specified value not to substantially change the threshold voltage.

15. The method of claim 14, including after applying the first bias pulse according to the first biasing arrangement, providing a signal indicating whether the memory cell passes or fails verification of whether the threshold voltage is below a low threshold verify voltage; and then if the memory cell passes verification, then applying the second bias pulse according to the second biasing arrangement in response to the signal.

16. The method of claim 15, including after applying the first bias pulse according to the first biasing arrangement, and applying the second bias pulse according to the second biasing arrangement in response to the signal, then providing a signal indicating whether the memory cell passes or fails verification of whether the threshold voltage is below a low threshold verify voltage; and then if the memory cell fails verification, then applying another pulse according to the first biasing arrangement.

17. The method of claim 15, including after applying the first bias pulse according to the first biasing arrangement, and applying the second bias pulse according to the second biasing arrangement in response to the signal, then providing a signal indicating whether the memory cell passes or fails verification of whether the threshold voltage is below a low threshold verify voltage; and then if the memory cell fails verification, then applying another pulse according to the first biasing arrangement followed by another pulse according to the second biasing arrangement.

18. The method of claim 14, wherein the negative voltage on the gate terminal, according to the first biasing arrangement, has an absolute value of about 3 volts or higher, and the positive voltage on the first channel terminal, according to the first biasing arrangement, has an absolute value of about 5 volts or higher.

19. The method of claim 14, wherein the positive voltage on the first channel terminal, according to the first biasing arrangement, has an absolute value of about 5 volts or higher.

20. The method of claim 14, wherein the gate voltage applied to the gate terminal, according to the second biasing arrangement is in a range from about −10 volts to −20 volts.

21. The method of claim 14, wherein the gate voltage applied to the gate terminal, according to the second biasing arrangement is in a range from about +10 volts to about −20 volts.

22. The method of claim 1, wherein said memory cells comprise nitride MOS memory cells.

23. The method of claim 1, wherein said memory cells have channel lengths of less than 0.25 microns.

24. A method for operating a charge trapping memory cell to establish a low threshold voltage state, the memory cell having a first channel terminal acting as a drain or source, a second channel terminal acting as a source or drain, a charge trapping structure and a gate terminal, the method comprising:
applying a pulse according to a first bias arrangement inducing hot hole injection into the charge trapping structure set a threshold voltage for the cell below a specified value for a low threshold state, the first biasing arrangement including applying a negative voltage to the gate terminal and positive voltage to the first channel terminal, while the second channel terminal is grounded; and applying a pulse according to a second bias arrangement causing convergence of the threshold voltage on the specified value for the low threshold state, the second biasing arrangement including applying a low voltage relative to the specified value to the gate terminal, applying a positive voltage to the first channel terminal and grounding the second channel terminal, wherein the positive voltage on the first channel terminal is high enough to inject electrons into the charge trapping structure when the threshold voltage is low relative to the specified value, and to cause injection of holes into the charge trapping structure when the threshold is high relative to the specified value.

25. The method of claim 24, including after applying the pulse according to the first biasing arrangement, providing a signal indicating whether the memory cell passes or fails verification of whether the threshold voltage is below a low threshold verify voltage; and then if the memory cell passes verification, then applying the pulse according to the second biasing arrangement in response to the signal.

26. The method of claim 25, including after applying the pulse according to the first biasing arrangement, and applying the pulse according to the second biasing arrangement in response to the signal, then providing a signal indicating whether the memory cell passes or fails verification of whether the threshold voltage is below a low threshold verify voltage; and then if the memory cell fails verification, then applying another pulse according to the first biasing arrangement.

27. The method of claim 25, including after applying the pulse according to the first biasing arrangement, and applying the pulse according to the second biasing arrangement in response to the signal, then providing a signal indicating whether the memory cell passes or fails verification of whether the threshold voltage is below a low threshold verify voltage; and then if the memory cells fails verification, then applying another pulse according to the first biasing arrangement followed by another pulse according to the second biasing arrangement.

28. The method of claim 24, wherein the negative voltage on the gate terminal, according to the first biasing arrangement, has an absolute value of about 3 volts or higher, and the positive voltage on the first channel terminal, according to the first biasing arrangement, has an absolute value of about 5 volts or higher.

29. The method of claim 24, wherein the positive voltage on the first channel terminal, according to the first biasing arrangement, has an absolute value of about 5 volts or higher.

30. The method of claim 24, wherein the positive voltage on the first channel terminal, according to the second biasing arrangement, has an absolute value of about 5 volts or higher, and the low voltage applied to the gate terminal, according to the second biasing arrangement is in arrange from about −1.5 volts to +11.5 volts.

31. The method of claim 24, wherein the low voltage applied to the gate terminal, according to the second biasing arrangement is in a range from about −1.5 volts to +1.5 volts.

32. The method of claim 24, wherein the low voltage applied to the gate terminal, according to the second biasing arrangement is in a range from about −1.5 volts to about ground.

33. The method of claim 24, wherein said memory cells comprise nitride MOS memory cells.

34. The method of claim 24, wherein said memory cells have channel lengths of less than 0.25 microns.

35. A method for operating a charge trapping memory cell to establish a low threshold voltage state, the memory cell formed in a semiconductor body, having a first channel terminal acting as a drain or source in the semiconductor body, a second channel terminal acting as a source or drain in the semiconductor body, a charge trapping structure and a gate terminal, the method comprising:

applying a pulse according to a first bias arrangement inducing hot hole injection into the charge trapping structure to set a threshold voltage for the cell below a specified value for a low threshold state, the first biasing arrangement including applying a negative voltage to the gate terminal and positive voltage to the first channel terminal, while the second channel terminal is grounded, the negative voltage applied to the gate terminal having an absolute value of less than 3 volts, and the positive voltage applied to the first channel terminal having an absolute value high enough to induce hot hole injection while the threshold voltage of the cells is greater than the specified value and to induce hot electron injection when the threshold voltage of the cell is near to the specified value in order to suppress overshoot of the specified voltage.

36. The method of claim 35, including after applying the pulse according to the first biasing arrangement, then providing a signal indicating whether the memory cell passes or fails verification of whether the threshold voltage is below a low threshold verify voltage; and then if the memory cell fails verification, then applying another pulse according to the first biasing arrangement.

37. The method of claim 35, wherein the negative voltage on the gate terminal, according to the first biasing arrangement, has an absolute value of about 1.5 volts or less, and the positive voltage on the first channel terminal, according to the first biasing arrangement, has an absolute value of about 6 volts or more.

38. The method of claim 35, wherein said memory cells comprise nitride MOS memory cells.

39. The method of claim 35, wherein said memory cells have channel lengths of less than 0.25 microns.

40. A method for operating a charge trapping memory cell to establish a low threshold voltage state, the memory cell formed in a semiconductor body, having a first channel terminal acting as a drain or source in the semiconductor body, a second channel terminal acting as a source or drain in the semiconductor body, a charge trapping structure and a gate terminal, the method comprising:

applying a pulse according to a first bias arrangement inducing hot hole injection into the charge trapping structure to set a threshold voltage for the cell below a specified value for a low threshold state, the first biasing arrangement including applying a negative voltage to the gate terminal and positive voltage to the first channel terminal, while the second channel terminal is grounded; and applying a pulse according to a second bias arrangement inducing E-field assisted tunneling causing convergence of the threshold voltage in the erase state toward the specified value.

41. The method of claim 40, wherein the second biasing arrangement includes applying a reference voltage near ground to the semiconductor body, applying a low voltage near ground or floating the first channel terminal, applying a low voltage near ground or floating the second channel terminal, and applying a gate voltage to the gate terminal, wherein the gate voltage has an absolute value high enough that when the threshold voltage is low relative to the specified value to change the threshold voltage to a value nearer to the specified value, and low enough that when the threshold voltage is near the specified value not to substantially change the threshold voltage.

42. The method of claim 40, including after applying the pulse according to the first biasing arrangement, providing a signal indicating whether the memory cell passes or fails verification of whether the threshold voltage is below a low threshold verify voltage; and then if the memory cell passes verification, then applying the pulse according to the second biasing arrangement in response to the signal.

43. The method of claim 42, including after applying the pulse according to the first biasing arrangement, and applying the pulse according to the second biasing arrangement in response to the signal, then providing a signal indicating whether the memory cell passes or fails verification of whether the threshold voltage is below a low threshold verify voltage; and then if the memory cell fails verification, then applying another pulse according to the first biasing arrangement.

44. The method of claim 42, including after applying the pulse according to the first biasing arrangement, and applying the pulse according to the second biasing arrangement in response to the signal, then providing a signal indicating whether the memory cell passes or fails verification of whether the threshold voltages is below a low threshold verify voltage; and then if the memory cell fails verification, then applying another pulse according to the first biasing arrangement followed by another pulse according to the second biasing arrangement.

45. The method of claim 40, wherein the negative voltage on the gate terminal, according to the first biasing arrangement, has an absolute value of about 3 volts or higher, and the positive voltage on the first channel terminal, according to the first biasing arrangement, has an absolute value of about 5 volts or higher.

46. The method of claim 40, wherein the positive voltage on the first channel terminal, according to the first biasing arrangement, has an absolute value of about 5 volts or higher.

47. The method of claim 41, wherein the gate voltage applied to the gate terminal, according to the second biasing arrangement is in a range from about −10 volts to −20 volts.

48. The method of claim 41, wherein the gate voltage applied to the gate terminal, according to the second biasing arrangement is in a range from about +10 volts to +20 volts.

49. The method of claim 40, wherein said memory cells comprise nitride MOS memory cells.

50. The method of claim 40, wherein said memory cells have channel lengths of less than 0.25 microns.

51. An integrated circuit, comprising:
a memory array including decoding circuitry to select memory cells for programming, the memory cells having first and second terminals in a substrate acting as sources and drains, a charge trapping structure, and a control gate;
a voltage supply circuit coupled to the memory array adapted to apply a gate voltage, a source voltage and a drain voltage to the control gate, first terminal and second terminal respectively, of memory cells in the array; and
a controller coupled to the decoding circuitry and to the voltage supply circuit, the controller adapted to execute an operation program including;
establishing a high threshold state in the memory cell by injecting negative charge into the charge trapping structure to set a threshold voltage for the cell above a high state threshold; and
establishing a low threshold state in the memory cell by reducing the negative charge in the charge trapping structure in set the threshold voltage for the cell below a specified value for the low threshold state, by applying a bias procedure which reduces negative charge in the charge trapping structure at a rate responsive to the amount of negative charge in the charge trapping structure during the bias pulse, and which increase negative charge in the charge trapping structure when the amount of negative charge in the charge trapping structure is reduced sufficiently that the threshold voltage is near or below the low state threshold, causing convergence of the threshold voltage in the low threshold state toward the specified value.

52. The integrated circuit of claim 51, wherein the bias procedure includes:
applying a first bias pulse according to first bias arrangement inducing hot hole injection into the charge trapping structure to set a threshold voltage in the memory cell to a low threshold state, the first biasing arrangement including applying a negative voltage to the gate terminal and a positive voltage to the first channel terminal, while the second channel terminal is grounded; and
applying a second bias pulse according to a second bias arrangement causing convergence of the threshold voltage toward the specified value, the second biasing arrangement including applying a low voltage relative to the specified value to the gate terminal, applying a positive voltage to the first channel terminal and grounding the second channel terminal, wherein the positive voltage on the first channel terminal is high enough to inject electrons into the charge trapping structure when the threshold voltage is low relative to the specified value, and to the cause injection of holes into the charge trapping structure when the threshold is high relative to the specified value.

53. The integrated circuit of claim 52, wherein the bias procedure includes after applying the first bias pulse according to the first biasing arrangement, providing a signal indicating whether the memory cell passes or fails verification of whether the threshold voltage is below a low threshold verify voltage; and then if the memory cell passes verification, then applying the second bias pulse according to the second biasing arrangement in response to the signal.

54. The integrated circuit of claim 53, wherein the bias procedure includes after applying the first bias pulse according to the first biasing arrangement, and applying the second bias pulse according to the second biasing arrangement in response to the signal, then providing a signal indicating whether the memory cell passes or fails verification of whether the threshold voltage is below a low threshold verify voltage; and then if the memory cell fails verification, then applying another bias according to the first biasing arrangement.

55. The integrated circuit of claim 53, wherein the bias procedure includes after applying the first bias pulse according to the first biasing arrangement, and applying the second bias pulse according to the second biasing arrangement in response to the signal, then providing a signal indicating whether the memory cell passes or fails verification of whether the threshold voltage is below a low threshold verify voltage; and then if the memory cell fails verification, then applying another pulse according to the first biasing arrangement followed by another pulse according to the second biasing arrangement.

56. The integrated circuit of claim 52, wherein the negative voltage on the gate terminal, according to the first biasing arrangement, has an absolute value of about 3 volts or higher, and the positive voltage on the first channel terminal, according to the fist biasing arrangement, has an absolute value of about 5 volts or higher.

57. The integrated circuit of claim 52, wherein the positive voltage on the first channel terminal, according to the first biasing arrangement, has an absolute value of about 5 volts or higher.

58. The integrated circuit of claim 52, wherein the positive voltage on the first channel terminal, according to the second biasing arrangement, has an absolute value of about 5 volts or higher, and the low voltage applied to the gate terminal, according to the second biasing arrangement is in a range from about −1.5 volts to +1.5 volts.

59. The integrated circuit of claim 52, wherein the low voltage applied to the gate terminal, according to the second biasing arrangement is in a range from about −1.5 volts to +1.5 volts.

60. The integrated circuit of claim 52, wherein the low voltage applied to the gate terminal, according to the second biasing arrangement is in a range from about −1.5 volts to about ground.

61. The integrated circuit of claim 51, wherein the bias procedure includes:
applying a bias pulse according to a first bias arrangement inducing hot hole injection into the charge trapping structure to set a threshold voltage in the memory cell to a low threshold state, the first biasing arrangement including applying a negative voltage to the gate terminal and positive voltage to the first channel terminal, while the second channel terminal is grounded, the negative voltage applied to the gate terminal having an absolute value of less than 3 volts, and the positive voltage applied to the first channel terminal having an absolute value high enough to induce hot hole injection while the threshold voltage of the cell is greater than the specified value and to induce hot electron injection when the threshold voltage of the cell is near to the specified value in order to suppress overshoot of the specified voltage.

62. The integrated circuit of claim 61, wherein the bias procedure includes after applying the bias pulse according to the first biasing arrangement, then providing a signal indicating whether the memory cell passes or fails verification of whether the threshold voltage is below a low threshold verify voltage; and then if the memory cell fails verification, then applying another pulse according to the first biasing arrangement.

63. The integrated circuit of claim 61, wherein the negative voltage on the gate terminal, according to the first biasing arrangement, has an absolute value of about 1.5 volts or less, and the positive voltage on the first channel terminal, according to the first biasing arrangement, has an absolute value of about 6 volts or more.

64. The integrated circuit of claim 51, wherein the bias procedure includes:
applying a first bias pulse according to a first bias arrangement inducing hot hole injection into the charge trapping structure to set a threshold voltage in the memory cell to a low threshold state, the first biasing arrangement including applying a negative voltage to the gate terminal and positive voltage to the first channel terminal, while the second channel terminal is grounded; and applying a second bias pulse according to a second bias arrangement including E-field assisted tunneling causing convergence of the threshold voltage in the low threshold state toward a specified value.

65. The integrated circuit of claim 64, wherein the second biasing arrangement includes applying a reference voltage near ground to the semiconductor body, applying a low voltage near ground or floating the first channel terminal, applying a low voltage near ground or floating the second channel terminal, and applying a gate voltage to the gate terminal, wherein the gate voltage has an absolute value high enough that when the threshold voltage is low relative to the specified value to change the threshold voltage to a value nearer to the specified value, and low enough that when the threshold voltage is near the specified value not to substantially change the threshold voltage.

66. The integrated circuit of claim 64, wherein the bias procedure includes after applying the first bias pulse according to the first biasing arrangement, providing a signal indicating whether the memory cell passes or fails verification of whether the threshold voltage is below a low threshold verify voltage; and then if the memory cell passes verification, then applying the second bias pulse according to the second biasing arrangement in response to the signal.

67. The integrated circuit of claim 64, wherein the bias procedure includes after applying the first bias pulse according to the first biasing arrangement, and applying the second bias pulse according to the second biasing arrangement in response to the signal, then providing a signal indicating whether the memory cell passes or fails verification of whether the threshold voltage is below a low threshold verify voltage; and then if the memory cell fails verification, then applying another pulse according to the first biasing arrangement.

68. The integrated circuit of claim 64, wherein the bias procedure includes after applying the first bias pulse according to the first biasing arrangement, and applying the second bias pulse according to the second biasing arrangement in response to the signal, the providing a signal indicating whether the memory cell passes or fails verification of whether the threshold voltage is below a low threshold verify voltage; and then if the memory cell fails verification, then applying another pulse according to the first biasing arrangement followed by another pulse according to the second biasing arrangement.

69. The integrated circuit of claim 64, wherein the negative voltage on the gate terminal, according to the first biasing arrangement, has an absolute value of about 3 volts or higher, and the positive voltage on the first channel terminal, according to the first biasing arrangement, has an absolute value of about 5 volts or higher.

70. The integrated circuit of claim 64, wherein the positive voltage on the first channel terminal, according to the first biasing arrangement, bias an absolute value of about 5 volts or higher.

71. The integrated circuit of claim 64, wherein the gate voltage applied to the gate terminal, according to the second biasing arrangement is in a range from about −10 volts in −20 volts.

72. The integrated circuit of claim 64, wherein the gate voltage applied to the gate terminal, according to the second biasing arrangement is in a range from about +10 volts to +20 volts.

73. The integrated circuit of claim 51, wherein said memory cells comprise nitride MOS memory cells.

74. The integrated circuit of claim 52, wherein said memory cells have channel lengths of less than 0.25 microns.

* * * * *